(12) United States Patent
Lan et al.

(10) Patent No.: US 9,553,576 B2
(45) Date of Patent: Jan. 24, 2017

(54) DRIVING CIRCUIT FOR IGBT MODULE

(71) Applicant: BYD COMPANY LIMITED, Shenzhen (CN)

(72) Inventors: Chengyu Lan, Shenzhen (CN); Qinyao Yang, Shenzhen (CN); Gang Chen, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 14/650,574

(22) PCT Filed: Dec. 31, 2013

(86) PCT No.: PCT/CN2013/091041
§ 371 (c)(1),
(2) Date: Jun. 9, 2015

(87) PCT Pub. No.: WO2014/101878
PCT Pub. Date: Jul. 3, 2014

(65) Prior Publication Data
US 2015/0326219 A1    Nov. 12, 2015

(30) Foreign Application Priority Data

Dec. 31, 2012  (CN) .......................... 2012 1 0589902

(51) Int. Cl.
*H03K 3/00* (2006.01)
*H03K 17/567* (2006.01)
(Continued)

(52) U.S. Cl.
CPC ............ *H03K 17/567* (2013.01); *H03K 17/14* (2013.01); *H03K 17/168* (2013.01); *H03K 17/785* (2013.01)

(58) Field of Classification Search
USPC ................. 327/108, 111–112, 387, 411–413, 419,327/427, 432, 434
See application file for complete search history.

(56) References Cited

U.S. PATENT DOCUMENTS

| 4,675,547 A | 6/1987 | Eichenwald |
| 4,713,601 A | 12/1987 | Zahm et al. |

(Continued)

FOREIGN PATENT DOCUMENTS

| CN | 1354561 A | 6/2002 |
| CN | 2788453 Y | 6/2006 |

(Continued)

*Primary Examiner* — An Luu
(74) *Attorney, Agent, or Firm* — Anova Law Group, PLLC

(57) ABSTRACT

A driving circuit for an IGBT module is provided. The driving circuit includes: a gate driving resistor connected with the IGBT module; a driving module connected with the gate driving resistor; an integrating circuit connected with the driving module, in which the integrating circuit comprises an equivalent resistor and a first capacitor connected in series with the equivalent resistor, and a time constant of the integrating circuit is adjusted by changing a resistance of the equivalent resistor; a first optical coupler connected with the integrating circuit; and a micro control unit, connected with the first optical coupler. The disclosed driving circuit for an IGBT module can adjust an equivalent resistance of the gate driving resistor, thus driving the IGBT module working at different powers without replacing the gate driving resistor, and improving an operation state of the IGBT module.

14 Claims, 2 Drawing Sheets

(51) Int. Cl.
   *H03K 17/14*   (2006.01)
   *H03K 17/16*   (2006.01)
   *H03K 17/785*  (2006.01)

(56) References Cited

U.S. PATENT DOCUMENTS

| | | | | |
|---|---|---|---|---|
| 5,808,504 | A * | 9/1998 | Chikai | H03K 17/0406 327/380 |
| 6,466,270 | B1 * | 10/2002 | Ichihara | H03L 7/0891 327/147 |
| 6,687,106 | B1 * | 2/2004 | Tanaka | H01L 27/0251 361/101 |
| 7,570,085 | B2 * | 8/2009 | Ishikawa | H03K 17/168 327/108 |
| 7,907,500 | B2 * | 3/2011 | Wang | G11B 20/10037 369/112.22 |
| 8,829,946 | B2 * | 9/2014 | Deboy | H03K 17/166 327/108 |
| 9,257,830 | B2 * | 2/2016 | Takeuchi | H02H 3/20 |
| 2002/0070772 | A1 | 6/2002 | Neacsu et al. | |
| 2005/0179482 | A1 | 8/2005 | Knoop et al. | |
| 2011/0221503 | A1 | 9/2011 | Oka | |

FOREIGN PATENT DOCUMENTS

| | | |
|---|---|---|
| CN | 101686044 A | 3/2010 |
| CN | 102594099 A | 7/2012 |
| EP | 0921624 A1 | 6/1999 |

* cited by examiner

DRIVING CIRCUIT FOR IGBT MODULE

CROSS REFERENCE TO RELATED APPLICATION

This application is a national phase entry under 35 U.S.C. §371 of International Application No. PCT/CN2013/091041, filed on Dec. 31, 2013, which claims priority to, and benefits of Chinese Patent Application Serial No. 201210589902.4, filed with the State Intellectual Property Office of P. R. C., on Dec. 31, 2012, the entire content of all of which is incorporated herein by reference.

TECHNICAL FIELD

Embodiments of the present disclosure generally relate to a circuit design field and, more particularly, to a driving circuit for an IGBT module.

BACKGROUND

An IGBT (Insulated Gate Bipolar Transistor) is a composite power electronic device, which is equivalent to a BJT (Bipolar Junction Transistor) with a thick base region driven by a MOSFET (Metal Oxide Semiconductor Field Effect Transistor). The IGBT not only has features of the MOSFET, such as a rapid response, a high input impedance, a great heat stability and a simple driving circuit, but also has features of the BJT, such as a high current density, a low on-state voltage drop and a high withstand voltage and, thus is widely used in power electronic devices.

Common driving circuits for an IGBT (such as EXB841, A316J, M57962) are generally isolated from the IGBT via an optical coupler. As shown in FIG. 1, the driving circuit comprises an MCU (Micro Control Unit) U1, a high speed photoelectric coupler U2, a transistor Q1 and a transistor Q2 for driving an IBGT module U4, a current-limiting resistor R1 for driving the high speed photoelectric coupler U2, a resistor R2 coupled with the transistors Q1 and Q2, a gate driving resistor R5, a resistor R4 for discharging a gate of the IGBT module U4 and preventing static, a voltage stabilization diode ZD1 and a voltage stabilization diode ZD2 used for overvoltage protection. The MCU U1 outputs a driving signal from a pulse-width modulation waveform output terminal PWM_1 to the resistor R1 so as to drive the photoelectric coupler U2 to work. Then, the photoelectric coupler U2 outputs a control signal to drive the transistors Q1 and Q2 to work via the resistor R2, such that the transistors Q1 and Q2 output an IGBT driving signal which drives the IGBT module U4 to work via the resistor R5.

As shown in FIG. 1, the gate driving resistor R5 is fixed in the circuit, and a resistance of the gate driving resistor R5 is constant and cannot be adjusted according to a power of the IGBT module U4, thus impacting operating performance of the IGBT module U4.

SUMMARY

Embodiments of the present disclosure seek to solve at least one of the problems existed in the prior art to at least some extent.

To achieve the above objective, a driving circuit for an IGBT module is provided according to some embodiments of the present disclosure. The driving circuit for an IGBT module comprises a gate driving resistor connected with the IGBT module; a driving module connected with the gate driving resistor; an integrating circuit connected with the driving module, in which the integrating circuit comprises an equivalent resistor and a first capacitor connected in series with the equivalent resistor, and a time constant of the integrating circuit is adjusted by changing a resistance of the equivalent resistor; a first optical coupler connected with the integrating circuit; and a micro control unit connected with the first optical coupler via a first resistor.

The driving circuit for an IGBT module according to embodiments of the present disclosure can adjust an equivalent resistance of the gate driving resistor, thus driving the IGBT module working at different powers without replacing the gate driving resistor, and improving an operation state of the IGBT module.

In some embodiments of the present disclosure, the equivalent resistor is formed by a second resistor and an output terminal resistor of a second optical coupler connected in parallel with the second resistor, and the resistance of the equivalent resistor is changed by changing an input current of the second optical coupler; an input terminal of the second resistor is connected with the first optical coupler and an output terminal of the second resistor is connected with the driving module; a first output terminal and a second output terminal of the second optical coupler are connected with the input terminal and the output terminal of the second resistor respectively; and a first terminal of the first capacitor is connected with the output terminal of the second resistor, and a second terminal of the first capacitor is grounded. Thus, the time constant of the integrating circuit can be adjusted by changing the input current of the second optical coupler, thereby realizing an adjustment of the equivalent resistance of the gate driving resistor.

In some embodiments of the present disclosure, a first input terminal of the second optical coupler is grounded, a second input terminal of the second optical coupler is connected with a movable contact of a potentiometer via a third resistor, in which a first fixed contact of the potentiometer is connected with the power source and a second fixed contact of the potentiometer is grounded. Thus, the time constant of the integrating circuit can be adjusted by changing a location of the movable contact of the potentiometer, thereby realizing an infinite adjustment to the equivalent resistance of the gate driving resistor.

In some embodiments of the present disclosure, a first input terminal of the second optical coupler is grounded, and a second input terminal of the second optical coupler is connected with a current output terminal of the micro control unit via a third resistor.

In some embodiment of the present disclosure, the driving circuit for the IGBT module further includes a temperature sensor. The temperature sensor is connected with a temperature signal input terminal of the micro control unit, and configured to detect a temperature of the IGBT module and to generate a temperature signal, such that the micro control unit adjusts an output current according to the temperature signal. Thus, the input current of the second optical coupler is adjusted, thereby realizing an adjustment of the equivalent resistance of the gate driving resistor, which makes the operation state of the IGBT module safer and reduces a failure rate of the IGBT module.

In some embodiments of the present disclosure, the driving circuit further includes a bus voltage sensor, connected with a bus voltage ripple signal input terminal of the micro control unit, and configured to detect a bus voltage connected with the IGBT module and to generate a bus voltage ripple signal, such that the micro control unit adjusts the output current according to the temperature signal and the bus voltage ripple signal. Thus, the IGBT module can work in an optimal state by automatically changing the equivalent resistance of the gate driving resistor according to requirements of the electromagnetic compatibility and the working temperature of the IGBT module.

In some embodiments of the present disclosure, the temperature sensor is an NTC (Negative Temperature Coefficient) thermal resistor. An initial resistance of the NTC thermal resistor is large, which can restrain the high current in the circuit, thus improving the reliability of the circuit.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
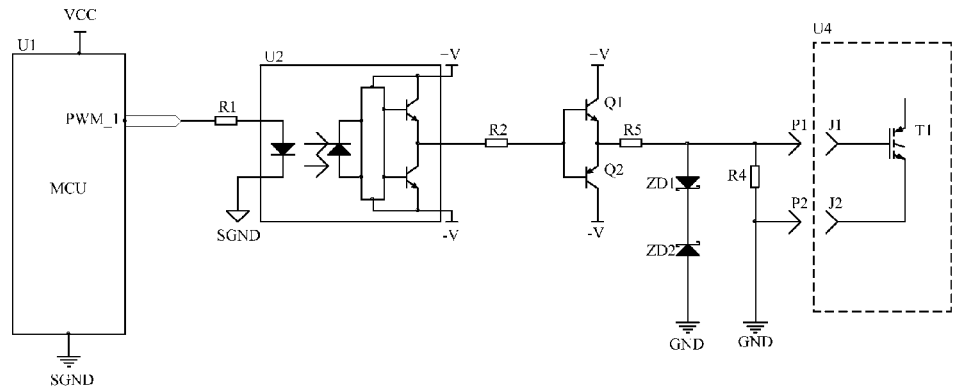
FIG. 1 is a schematic diagram of a driving circuit for an IGBT module in the prior art.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the description of the present disclosure, unless specified or limited otherwise, it should be noted that, terms "mounted", "connected", "coupled" and "fastened" may be understood broadly, such as permanent connection or detachable connection, electrical connection or mechanical connection, direct connection or indirect connection via intermediary, inner communication or interaction between two elements. These having ordinary skills in the art should understand the specific meanings in the present disclosure according to specific situations.

Figure 2:
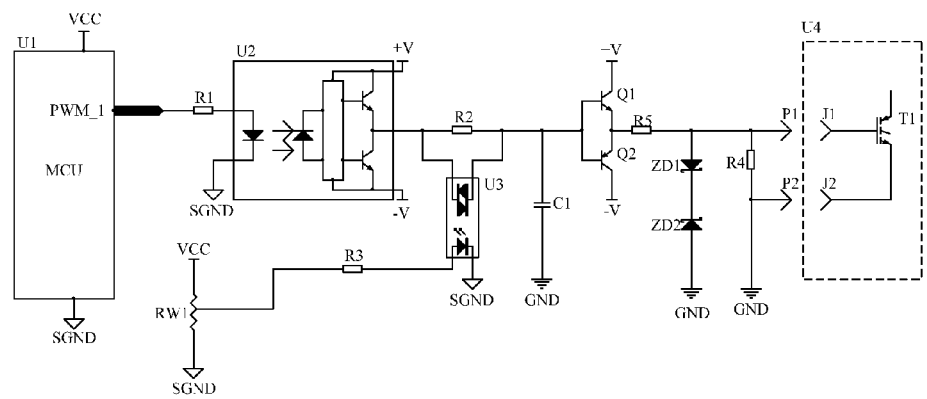
FIG. 2 is a schematic diagram of a driving circuit for an IGBT module according to a first embodiment of the present disclosure.
Figure 3:
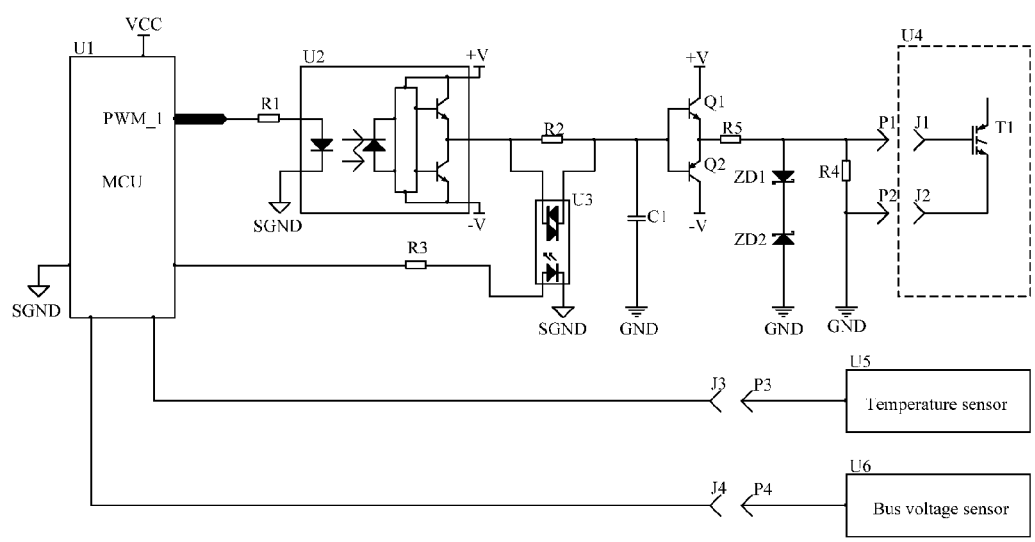
FIG. 3 is a schematic diagram of a driving circuit for an IGBT module according to a second embodiment of the present disclosure.

According to embodiments of the present disclosure, a driving circuit for an IGBT module is provided. As shown in FIGS. 2 and 3, the driving circuit for an IGBT module U4 includes a micro control module U1, a first optical coupler U2, an integrating circuit, a gate driving resistor R5 and a driving module. A pulse-width modulation waveform output terminal PWM_1 of the micro control unit U1 is connected with the first optical coupler U2 via a first resistor R1 and the first resistor R1 is a current-limiting resistor. The driving module includes a first transistor Q1 and a second transistor Q2 configured to gain a voltage across the gate driving resistor R5. A base of the first transistor Q1 is connected with the integrating circuit, a collector of the first transistor Q1 is connected with a positive electrode of a power source, and an emitter of the first transistor Q1 is connected with the gate driving resistor R5. A base of the second transistor Q2 is connected with the integrating circuit, a collector of the second transistor Q2 is connected with a negative electrode of the power source, and an emitter of the second transistor Q2 is connected with the gate driving resistor R5. The first transistor Q1 and the second transistor Q2 are power transistors for driving the IGBT module U4 and function as current followers. The gate driving resistor R5 is connected between the driving module and the IGBT module U4. The integrating circuit is connected between the first optical coupler U1 and the driving module, and includes an equivalent resistor and a first capacitor C1 connected in series with the equivalent resistor. A time constant of the integrating circuit is adjusted by changing a resistance of the equivalent resistor, thus realizing an equivalent adjustment to the resistance of the gate driving resistor R5.

In some embodiments of the present disclosure, the driving circuit for an IGBT module may further include a voltage regulating module used for overvoltage protection. The voltage regulating module may include a first voltage stabilization diode ZD1 and a second voltage stabilization diode ZD2. A first terminal of the first voltage stabilization diode ZD1 is connected with the gate driving resistor R5, a first terminal of the second voltage stabilization diode ZD2 is connected with a second terminal of the first voltage stabilization diode ZD1, and a second terminal of the second voltage stabilization diode ZD2 is grounded. An output terminal of the gate driving resistor R5 is grounded via the first voltage stabilization diode ZD1 and via the second voltage stabilization diode ZD2. The first voltage stabilization diode ZD1 and the second voltage stabilization diode ZD2 are overvoltage protection diodes and are configured to ensure a stable input voltage of the IGBT module U4.

As shown in FIG. 2, in this embodiment, the IGBT module U4 includes an IGBT T1, a first socket J1 and a second socket J2. The first socket J1 is connected with a gate of the IGBT T1, and the second socket J2 is connected with a drain of the IGBT T1.

As shown in FIGS. 2-3, the driving circuit for an IGBT module may further include a fourth resistor R4 configured to discharge a gate of the IGBT module and to prevent static. A first terminal of the fourth resistor R4 is grounded, and a second terminal of the fourth resistor R4 is connected with the gate driving resistor R5. The output terminal of the gate driving resistor R5 is connected with the first socket J1 of the IGBT module U4 via a first plug P1. In other words, the fourth resistor R4 is also connected between the first plug P1 and the ground. The second socket J2 is grounded via a second plug P2.

In this embodiment, as shown in FIGS. 2 and 3, the integrating circuit includes a second resistor R2, the first capacitor C1 and a second optical coupler U3. An input terminal of the second resistor R2 is connected with the first optical coupler U1 and an output terminal of the second resistor R2 is connected with the driving module. A first terminal of the first capacitor C1 is connected with the output terminal of the second resistor R2, and a second terminal of the first capacitor C1 is grounded. A first output terminal and a second output terminal of the second optical coupler U3 are connected with the input terminal and the output terminal of the second resistor R2 respectively. The equivalent resistor is formed by the second resistor R2 and an output terminal resistor of the second optical coupler U3 connected in parallel with the second resistor R2, and the resistance of the equivalent resistor is changed by changing an input current of the second optical coupler U3.

In one embodiment of the present disclosure, as shown in FIG. 2, a first input terminal of the second optical coupler U3 is grounded, and a second input terminal of the second optical coupler U3 is connected with a movable contact of an adjustable resistor (e.g., a potentiometer) RW1 via a third resistor R3. A first fixed contact of the potentiometer RW1 is connected with the power source and a second fixed contact of the potentiometer RW1 is grounded. By changing a location of the movable contact of the potentiometer RW1, the input current of the second optical coupler U3 can be changed, and the resistance of the equivalent resistor of the integrating circuit can be adjusted so as to adjust the time constant of the integrating circuit, such that a change rate dv/dt at which a gate driving voltage of the IGBT module U4 changes with time can be adjusted, thus realizing an infinite adjustment to the equivalent resistance of the gate driving resistor R5.

Taking increasing the equivalent resistance of the gate driving resistor R5 as an example, when the movable contact of the potentiometer RW1 moves towards the first fixed contact connected with the power source, a divider resistance of the potentiometer RW1 connected in the circuit decreases, the input current of the second optical coupler U3 increases, and a lighting intensity of an light-emitting diode in the second optical coupler U3 increases, which decreases a resistance of a light receiving diode in the second optical coupler U3, i.e., decreases the resistance of the output terminal resistor of the second optical coupler U3. Since the equivalent resistor is formed by the second resistor R2 and the output terminal resistor of the second optical coupler U3 connected in parallel with the second resistor R3, the resistance of the equivalent resistor of the integrating circuit decreases as the resistance of the output terminal resistor of the second optical coupler U3 decreases. The time constant of the integrating circuit is $\tau=R*C$, in which R is the resistance of the equivalent resistor, and C is a capacitance of the first capacitor C1. When the resistance of the equivalent resistor decreases and the capacitance of the first capacitor C1 keeps constant, the time constant decreases, i.e., a variation per unit time of a voltage across the capacitor C1 increases. The first transistor Q1 and the second transistor Q2 form a voltage follower, and a voltage variation per unit time of the output terminals of the first transistor Q1 and the second transistor Q2 increases as the variation per unit time of the voltage across the capacitor C1 increases, i.e., the voltage increases quickly per unit time and the voltage change rate dv/dt increases, which is equivalent to the decreasing of the resistance of the gate driving resistor R5.

When the movable contact of the potentiometer RW1 moves towards the second fixed contact, the divider resistance of the potentiometer RW1 connected in the circuit increases, the input current of the second optical coupler U3 decreases, and the lighting intensity of the light-emitting diode in the second optical coupler U3 decreases, which increases the resistance of the light receiving diode in the second optical coupler U3, i.e., increases the resistance of the output terminal resistor of the second optical coupler U3. Thus, the resistance of the equivalent resistor of the integrating circuit increases and the time constant $\tau$ increases, i.e., the variation per unit time of the voltage across the first capacitor C1 decreases. The voltage variation per unit time of the output terminals of the first transistor Q1 and the second transistor Q2 decreases, i.e., the voltage increases slowly per unit time and the voltage change rate dv/dt decreases, which is equivalent to the increment of the resistance of the gate driving resistor R5.

According to certain embodiments of the present disclosure, by changing the location of the movable contact of the potentiometer RW1, the input current of the second optical coupler U3 is changed, which adjusts the resistance of the equivalent resistor of the integrating circuit and further changes the time constant, thus realizing the infinite adjustment to the resistance of the gate driving resistor R5.

In certain other embodiments of the present disclosure, as shown in FIG. 3, the first terminal of the second optical coupler U3 is grounded, and the second terminal of the second optical coupler U3 is connected with the current output terminal of the micro control unit U1 via the third resistor R3. The driving circuit may further include a temperature sensor U5. The temperature sensor U5 is connected with the temperature signal input terminal of the micro control unit U1 and configured to detect a temperature of the IGBT module U4 and to generate a temperature signal, such that the micro control unit U1 adjusts an output current according to the temperature signal.

In certain embodiments of the present disclosure, the temperature sensor U5 may be, but is not limited to, a thermal resistor, and preferably is an NTC thermal resistor. The NTC thermal resistor has a large initial resistance, which can limit the large current in the circuit and improve the reliability of the circuit. When the IGBT module U4 works at a low output power, the temperature sensor U5 detects that the temperature of the IGBT module U4 is low and generates a corresponding temperature signal. Then, the micro control unit U1 reduces the output terminal current according to the temperature signal generated by the temperature sensor U5, i.e., the input current of the second optical coupler U3 decreases, and the lighting intensity of the light-emitting diode in the second optical coupler U3 decreases, which increases the resistance of the light receiving diode in the second optical coupler U3, i.e., increases the resistance of the output terminal resistor of the second optical coupler U3. Thus, the resistance of the equivalent resistor of the integrating circuit increases, the time constant $\tau$ increases, and the variation per unit time of the voltage across the first capacitor C1 decreases. The voltage variation per unit time of the output terminals of the first transistor Q1 and the second transistor Q2 also decreases, i.e., the voltage increases slowly per unit time and the voltage change rate dv/dt decreases, which is equivalent to the increment of the resistance of the gate driving resistor R5. Thus, the interference is reduced.

When the IGBT module U4 works at a high output power, the temperature sensor U5 detects that the temperature of the IGBT module U4 is high and generates a corresponding temperature signal. Then, the micro control unit U1 increases the output current according to the temperature signal generated by the temperature sensor U5, i.e., the input current of the second optical coupler U3 increases, and the lighting intensity of the light-emitting diode in the second optical coupler U3 increases, which decreases the resistance of the light receiving diode in the second optical coupler U3, i.e., decreases the resistance of the output terminal resistor of the second optical coupler U3. Thus, the resistance of the equivalent resistor of the integrating circuit decreases, the time constant $\tau$ decreases, and the variation per unit time of the voltage across the first capacitor C1 increases. The voltage variation per unit time of the output terminals of the first transistor Q1 and the second transistor Q2 also increases, i.e., the voltage increases quickly per unit time and the voltage change rate dv/dt increases, which is equivalent to the decreasing of the resistance of the gate driving resistor R5. Thus, the energy consumption and the temperature of the IGBT module U4 are reduced, which makes the IGBT module U4 work in a safer environment and have a lower failure rate.

In certain embodiments of the present disclosure, as shown in FIG. 3, the driving circuit may further include a bus voltage sensor U6 connected with a bus voltage ripple signal input terminal of the micro control unit U1. The bus voltage sensor U6 is configured to detect a bus voltage connected with the IGBT module U4 and to generate a bus voltage ripple signal, such that the micro control unit U1 adjusts the output current according to the temperature signal generated by the temperature sensor U5 and the bus voltage ripple signal.

When the bus voltage sensor U6 transmits a large bus voltage ripple signal to the micro control unit U1, the change rate dv/dt at which the gate driving voltage of the IGBT module U4 changes with time is relatively large, i.e., the resistance of the gate driving resistor R5 is relatively small, which is not beneficial to the electromagnetic compatibility. Under a rated load working state, when the temperature of the IGBT module U4 is relatively low at this time, the micro control unit U1 controls the output current thereof to decrease, i.e., the input current of the second optical coupler U3 decreases, the resistance of the output terminal resistor of the second optical coupler U3 increases, the resistance of the equivalent resistor of the integrating circuit increases, the time constant τ increases, and the variation per unit time of the voltage across the first capacitor C1 decreases. The voltage variation per unit time of the output terminals of the first transistor Q1 and the second transistor Q2 decreases, i.e., the voltage increases slowly per unit time and the voltage change rate dv/dt decreases, which is equivalent to the increment of the resistance of the gate driving resistor R5. Thus, the bus voltage ripple is reduced so as to make the IGBT module U4 work in an optimal operation state considering the temperature and the electromagnetic compatibility.

On the contrary, when the bus voltage sensor U6 transmits a small bus voltage ripple signal to the micro control unit U1, the change rate dv/dt at which the gate driving voltage of the IGBT module U4 changes with time is relatively small, i.e., the resistance of the gate driving resistor R5 is relatively large, which is beneficial to the electromagnetic compatibility. However, when the temperature of the IGBT module U4 is relatively high at this time, in order to make the IGBT module U4 work in the optimal operation state, the micro control unit U1 controls the output current thereof to increase, i.e., the input current of the second optical coupler U3 increases, the resistance of the output terminal resistor of the second optical coupler U3 decreases, the resistance of the equivalent resistor of the integrating circuit decreases, the time constant τ decreases, and the variation per unit time of the voltage across the first capacitor C1 increases. The voltage variation per unit time of the output terminals of the first transistor Q1 and the second transistor Q2 increases, i.e., the voltage increases quickly per unit time and the voltage change rate dv/dt increases, which is equivalent to the decreasing of the resistance of the gate driving resistor R5, thus making the IGBT module U4 work in the optimal operation state considering the temperature and the electromagnetic compatibility.

In one embodiment of the present disclosure, the temperature sensor U5 is connected with a plug P3, the temperature signal input terminal of the micro control unit U1 is connected with a socket J3, and the temperature sensor U5 is connected with the micro control unit U1 by connecting the socket J3 with the plug P3. In another embodiment, the bus voltage sensor U6 is connected with a plug P4, the bus voltage ripple signal input terminal of the micro control unit U1 is connected with a socket J4, and the bus voltage sensor U6 is connected with the micro control unit U1 by connecting the plug P4 with the socket J4. Such a connection is more flexible and convenient.

According to some embodiments of the present disclosure, by providing the temperature sensor U5 and the bus voltage sensor U6, the micro control unit U1 can adjust the output current according to the temperature signal input by the temperature sensor U5 and the bus voltage ripple signal input by the bus voltage sensor U6, thus automatically adjusting the equivalent resistance of the gate driving resistor R5 according to the requirements of the temperature and the electromagnetic compatibility to make the IGBT module U4 work in the optimal operation state.

The driving circuit for an IGBT module according to embodiments of the present disclosure can adjust an equivalent resistance of the gate driving resistor, thus driving the IGBT module U4 working at different powers without replacing the gate driving resistor, improving an operation state of the IGBT module.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A driving circuit for an IGBT module, comprising:
   a gate driving resistor connected with the IGBT module;
   a driving module connected with the gate driving resistor;
   an integrating circuit connected with the driving module, wherein the integrating circuit comprises an equivalent resistor and a first capacitor connected in series with the equivalent resistor, a time constant of the integrating circuit is adjusted by changing a resistance of the equivalent resistor, and the equivalent resistor is formed by a second resistor and an output terminal resistor of a second optical coupler connected in parallel with the second resistor;
   a first optical coupler connected with the integrating circuit; and
   a micro control unit connected with the first optical coupler via a first resistor.

2. The driving circuit according to claim 1, wherein the driving module is configured to gain a voltage across the gate driving resistor and comprises a first transistor and a second transistor;
   a base of the first transistor is connected with the integrating circuit, a collector of the first transistor is connected with a positive electrode of a power source, and an emitter of the first transistor is connected with the gate driving resistor; and a base of the second transistor is connected with the integrating circuit, a collector of the second transistor is connected with a negative electrode of the power source, and an emitter of the second transistor is connected with the gate driving resistor.

3. The driving circuit according to claim 1, further comprising a voltage regulating module used for overvoltage protection, wherein the voltage regulating module comprises:
a first voltage stabilization diode, wherein a first terminal of the first voltage stabilization diode is connected with the gate driving resistor; and
a second voltage stabilization diode, wherein a first terminal of the second voltage stabilization diode is connected with a second terminal of the first voltage stabilization diode and a second terminal of the second voltage stabilization diode is grounded.

4. The driving circuit according to claim 1, further comprising:
a third resistor configured to discharge a gate of the IGBT module and to prevent static, wherein a first terminal of the third resistor is grounded, and a second terminal of the third resistor is connected with the gate driving resistor.

5. A driving circuit for an IGBT module, comprising:
a gate driving resistor connected with the IGBT module;
a driving module connected with the gate driving resistor;
an integrating circuit connected with the driving module, wherein the integrating circuit comprises an equivalent resistor and a first capacitor connected in series with the equivalent resistor, and a time constant of the integrating circuit is adjusted by changing a resistance of the equivalent resistor;
a first optical coupler connected with the integrating circuit; and
a micro control unit connected with the first optical coupler via a first resistor;
wherein:
the equivalent resistor is formed by a second resistor and an output terminal resistor of a second optical coupler connected in parallel with the second resistor, and the resistance of the equivalent resistor is changed by changing an input current of the second optical coupler;
an input terminal of the second resistor is connected with the first optical coupler and an output terminal of the second resistor is connected with the driving module;
a first output terminal and a second output terminal of the second optical coupler are connected with the input terminal and the output terminal of the second resistor respectively; and
a first terminal of the first capacitor is connected with the output terminal of the second resistor, and a second terminal of the first capacitor is grounded.

6. The driving circuit according to claim 5, wherein a first input terminal of the second optical coupler is grounded, a second input terminal of the second optical coupler is connected with a movable contact of a potentiometer via a third resistor, in which a first fixed contact of the potentiometer is connected with the power source and a second fixed contact of the potentiometer is grounded.

7. The driving circuit according to claim 6, wherein:
a location of the movable contact of the potentiometer is able to be changed to change an input current of the second optical coupler such that the resistance of the equivalent resistor of the integrating circuit is adjusted so as to adjust a time constant of the integrating circuit.

8. The driving circuit according to claim 5, wherein a first input terminal of the second optical coupler is grounded, and a second input terminal of the second optical coupler is connected with a current output terminal of the micro control unit via a third resistor.

9. The driving circuit according to claim 8, wherein:
the micro control unit is configured to change an input current to the second optical coupler through the current output terminal such that the resistance of the equivalent resistor of the integrating circuit is adjusted so as to adjust a time constant of the integrating circuit.

10. The driving circuit according to claim 8, further comprising:
a temperature sensor, connected with a temperature signal input terminal of the micro control unit, and configured to detect a temperature of the IGBT module and to generate a temperature signal, such that the micro control unit adjusts an output current according to the temperature signal.

11. The driving circuit according to claim 10, further comprising:
a bus voltage sensor, connected with a bus voltage ripple signal input terminal of the micro control unit, and configured to detect a bus voltage connected with the IGBT module and to generate a bus voltage ripple signal, such that the micro control unit adjusts the output current according to the temperature signal and the bus voltage ripple signal.

12. The driving circuit according to claim 11, wherein:
the output current from the micro control unit corresponds to an input current to the second optical coupler; and
the micro control unit is configured to change an input current to the second optical coupler, based on the temperature signal and the bus voltage ripple signal, such that the resistance of the equivalent resistor of the integrating circuit is adjusted so as to adjust a time constant of the integrating circuit.

13. The driving circuit according to claim 10, wherein:
the output current from the micro control unit corresponds to an input current to the second optical coupler; and
the micro control unit is configured to change an input current to the second optical coupler, based on the temperature signal, such that the resistance of the equivalent resistor of the integrating circuit is adjusted so as to adjust a time constant of the integrating circuit.

14. The driving circuit according to claim 10, wherein the temperature sensor comprises an NTC thermal resistor.

* * * * *